US012808057B2

(12) United States Patent
Ifuku et al.

(10) Patent No.: US 12,808,057 B2
(45) Date of Patent: Nov. 24, 2026

(54) FILM FORMING METHOD AND FILM FORMING SYSTEM

(71) Applicant: Tokyo Electron Limited, Tokyo (JP)

(72) Inventors: Ryota Ifuku, Nirasaki (JP); Takashi Matsumoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 19/077,413

(22) Filed: Mar. 12, 2025

(65) Prior Publication Data

US 2025/0207261 A1 Jun. 26, 2025

Related U.S. Application Data

(63) Continuation of application No. PCT/JP2023/032189, filed on Sep. 4, 2023.

(30) Foreign Application Priority Data

Sep. 16, 2022 (JP) ................................ 2022-148372

(51) Int. Cl.
*C23C 16/56* (2006.01)
*C23C 16/26* (2006.01)
(Continued)

(52) U.S. Cl.
CPC .............. *C23C 16/56* (2013.01); *C23C 16/26* (2013.01); *C23C 16/511* (2013.01); *C23C 16/52* (2013.01);
(Continued)

(58) Field of Classification Search
CPC ....... C23C 16/56; C23C 16/26; C23C 16/511; C23C 16/52; H01J 37/3222;
(Continued)

(56) References Cited

U.S. PATENT DOCUMENTS

2015/0137377 A1* 5/2015 Bao ....................... H10W 20/42 257/758
2018/0057933 A1* 3/2018 Ifuku ...................... C23C 16/26

FOREIGN PATENT DOCUMENTS

JP 2011-178644 A 9/2011
JP 2015017022 A * 1/2015
(Continued)

OTHER PUBLICATIONS

Machine translation, JP-2015017022-A (Year: 2015).*
Machine Translation, JP-2022007053-A (Year: 2022).*

*Primary Examiner* — Michael G Miller
(74) *Attorney, Agent, or Firm* — Armstrong Teasdale LLP

(57) ABSTRACT

A film forming method of forming a graphene film, includes: a process of preparing a substrate including a metal film; a first process of setting the substrate to a first temperature, generating plasma, and forming the graphene film having a first film thickness on the metal film using the plasma; a second process of setting the substrate to a second temperature higher than the first temperature, reducing a thickness of the graphene film to be less than the first film thickness while maintaining a continuity of the graphene film, and dissolving carbon atoms in solid solution in the metal film; and a third process of setting the substrate to a third temperature lower than the second temperature, increasing the thickness of the graphene film by precipitating the carbon atoms in the metal film at an interface between the metal film and the graphene film, and forming a modified graphene film.

13 Claims, 9 Drawing Sheets

(51) Int. Cl.
*C23C 16/511* (2006.01)
*C23C 16/52* (2006.01)
*H01J 37/32* (2006.01)

(52) U.S. Cl.
CPC .... *H01J 37/3222* (2013.01); *H01J 37/32229* (2013.01); *H01J 2237/3321* (2013.01)

(58) Field of Classification Search
CPC ........ H01J 37/32229; H01J 2237/3321; C01B 32/186; C01B 29/04; C01B 33/02; H10P 14/42
See application file for complete search history.

(56) References Cited

FOREIGN PATENT DOCUMENTS

JP 2018-035047 A 3/2018
JP 2022-7053 A 1/2022
JP 2022007053 A * 1/2022 ........... C23C 16/511

* cited by examiner

FILM FORMING METHOD AND FILM FORMING SYSTEM

CROSS-REFERENCE TO RELATED APPLICATION

The application is a Bypass Continuation application of PCT International Application No. PCT/JP2023/032189, filed on Sep. 4, 2023 and designating the United States, the international application being based upon and claiming the benefit of priority from Japanese Patent Application No. 2022-148372, filed on Sep. 16, 2022, the entire content of which is incorporated herein by reference.

TECHNICAL FIELD

The present disclosure relates to a film forming method and a film forming system.

BACKGROUND

Patent Document 1 discloses a method of manufacturing a graphene film, including forming a catalyst thin film on a crystalline substrate, heating the catalyst thin film to form a crystalline catalyst thin film that is selectively oriented with high order, and heating a gaseous carbon source to cool the catalyst thin film, thereby forming the graphene film on the catalyst thin film.

PRIOR ART DOCUMENTS

Patent Documents

Patent Document 1: Japanese Patent Laid-open Publication No. 2011-178644

SUMMARY

According to one embodiment of the present disclosure, there is provided film forming method of forming a graphene film, includes: a process of preparing a substrate including a metal film; a first process of setting the substrate to a first temperature, generating plasma by supplying a carbon-containing gas, and forming the graphene film having a first film thickness on the metal film using the generated plasma; a second process of setting the substrate to a second temperature higher than the first temperature, reducing a thickness of the graphene film to be less than the first film thickness while maintaining a continuity of the graphene film, and dissolving carbon atoms in solid solution in the metal film; and a third process of setting the substrate to a third temperature lower than the second temperature, increasing the thickness of the graphene film by precipitating the carbon atoms in the metal film at an interface between the metal film and the graphene film, and forming a modified graphene film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinbelow, embodiments of a film forming method and a film forming system disclosed herein will be described in detail with reference to the drawings. Additionally, disclosed technology is not limited to the following embodiments.

In various processes for metal fine wiring, if aggregation or surface roughness occurs on a surface of a metal wire, this may lead to deterioration of characteristics in subsequent processing processes or deterioration of characteristics of the metal wire itself. For this reason, improvement in characteristics is being sought by capping the metal wire with a graphene film. However, such an effect may not be sufficient due to the film quality of the graphene film or an underlying metal film (metal wire). Therefore, it is expected that the film quality of the graphene film or the underlying metal film will be improved.

[Configuration of Film Forming Apparatus 1]

Figure 1:
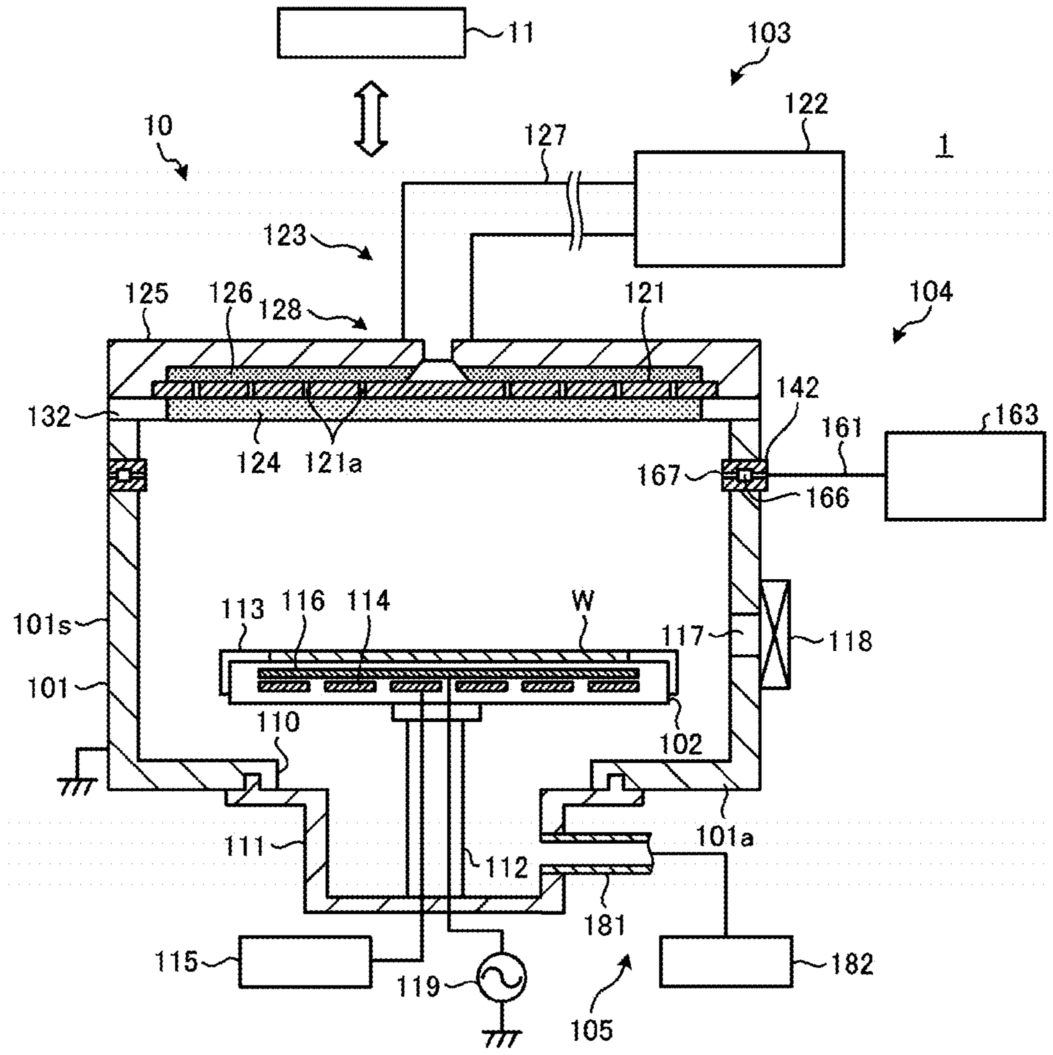
FIG. 1 is a schematic cross-sectional view showing an example of a film forming apparatus according to an embodiment of the present disclosure.

FIG. 1 is a schematic cross-sectional view showing an example of a film forming apparatus according to an embodiment of the present disclosure. A film forming apparatus 1 shown in FIG. 1 is configured as, for example, a plasma processing apparatus of a radial line slot antenna (RLSA™) microwave plasma type. The film forming apparatus 1 is an example of a substrate processing apparatus. The film forming apparatus 1 constitutes a film forming system together with an annealing apparatus 2 described later.

The film forming apparatus 1 includes an apparatus main body 10 and a controller 11 that controls the apparatus main body 10. The apparatus main body 10 includes a chamber 101, a stage 102, a microwave introduction mechanism 103, a gas supply mechanism 104, and an exhaust mechanism 105.

The chamber 101 is formed in an approximately cylindrical shape, and an opening 110 is formed at an approximately central portion of a bottom wall 101*a* of the chamber 101. The bottom wall 101*a* is provided with an exhaust chamber 111 that communicates with the opening 110 and protrudes downward. An opening 117 through which a substrate (referred to hereinafter as a wafer) W passes is formed in a sidewall 101*s* of the chamber 101. The opening 117 is opened and closed by a gate valve 118. In addition, the chamber 101 is an example of a processing container.

The substrate W as a processing target is placed on the stage 102. The stage 102 has an approximately disc shape and is made of ceramics such as aluminum nitride (AlN). The stage 102 is supported by a cylindrical support member 112 made of ceramics such as AlN, which extends upward from approximately the center of the bottom of the exhaust chamber 111. An edge ring 113 is installed on an outer edge of the stage 102 to surround the substrate W placed on the stage 102. Further, a lifting pin (not shown) for raising and lowering the substrate W is installed inside the stage 102 so as to protrude and retract relative to an upper surface of the stage 102.

A resistive heating type heater 114 is embedded inside the stage 102. The heater 114 heats the substrate W placed on the stage 102 according to power supplied from a heater power supply 115. Further, a thermocouple (not shown) is inserted into the stage 102, and the temperature of the substrate W is controllable to, for example, a range of 350 degrees C. to 850 degrees C. based on a signal from the thermocouple. Furthermore, an electrode 116 having approximately the same size as the substrate W is embedded inside the stage 102 above the heater 114, and a bias power supply 119 is electrically connected to the electrode 116. The bias power supply 119 supplies bias power having a predetermined frequency and magnitude to the electrode 116. The bias power supplied to the electrode 116 allows ions to be drawn into the substrate W placed on the stage 102. In addition, the bias power supply 119 may not be provided according to characteristics of plasma processing.

The microwave introduction mechanism 103 is installed at an upper portion of the chamber 101 and includes an antenna 121, a microwave output portion 122, and a microwave transmission mechanism 123. The antenna 121 includes a plurality of slots 121*a* serving as through-holes. The microwave output portion 122 outputs microwaves. The microwave transmission mechanism 123 guides the microwaves output from the microwave output portion 122 to the antenna 121.

A dielectric window 124 made of a dielectric is installed below the antenna 121. The dielectric window 124 is supported by a support member 132 which is provided in a ring shape at the upper portion of the chamber 101. A wave retardation plate 126 is installed on the antenna 121. A shield member 125 is installed on the antenna 121. A flow path, which is not shown, is provided inside the shield member 125. The shield member 125 cools the antenna 121, the dielectric window 124, and the wave retardation plate 126 using a fluid such as water flowing into the flow path.

The antenna 121 is made of, for example, a copper plate or aluminum plate with a silver- or gold-plated surface, and the plurality of slots 121*a* for radiating microwaves is arranged in a predetermined pattern. The arrangement pattern of the slots 121*a* is appropriately set to evenly radiate the microwaves. An example of an appropriate pattern is a radial line slot in which a plurality of pairs of slots 121*a* each including two slots 121*a* arranged in a T-shape is concentrically arranged. The length and arrangement spacing of the slots 121*a* are appropriately determined depending on an effective wavelength $\lambda g$ of the microwaves. The slots 121*a* may have another shape such as a circular shape or an arc shape. Furthermore, the arrangement form of the slots 121*a* is not particularly limited and may have, for example, a spiral shape or a radial shape, in addition to a concentric shape. The pattern of the slots 121*a* is appropriately set to achieve microwave radiation characteristics by which desired plasma density distribution is obtained.

The wave retardation plate 126 is made of a dielectric having a dielectric constant higher than that of vacuum such as quartz, ceramics ($Al_2O_3$), polytetrafluoroethylene, or polyimide. The wave retardation plate 126 has a function of reducing the wavelength of the microwaves compared to that in vacuum, thereby making the antenna 121 smaller in size. In addition, the dielectric window 124 is also made of the same dielectric as the wave retardation plate 126.

The thicknesses of the dielectric window 124 and the wave retardation plate 126 are adjusted so that an equivalent circuit formed by the wave retardation plate 126, the antenna 121, the dielectric window 124, and plasma satisfies a resonance condition. The phase of the microwaves may be adjusted by adjusting the thickness of the wave retardation plate 126. By adjusting the thickness of the wave retardation plate 126 so that the junction of the antenna 121 becomes the "antinode" of standing waves, microwave reflection is minimized and the radiative energy of the microwaves may be maximized. Further, interfacial reflection of the microwaves may be prevented using the same material for the wave retardation plate 126 and the dielectric window 124.

The microwave output portion 122 has a microwave oscillator. The microwave oscillator may be of a magnetron type or a solid-state type. The frequency of microwaves generated by the microwave oscillator is, for example, in a range of 300 MHz to 10 GHz. As an example, the microwave output portion 122 outputs microwaves having a frequency of 2.45 GHz using the magnetron-type microwave oscillator. The microwaves are an example of electromagnetic waves.

The microwave transmission mechanism 123 includes a waveguide 127 and a coaxial waveguide 128. In addition, the microwave transmission mechanism 123 may further include a mode conversion mechanism. The waveguide 127 guides the microwaves output from the microwave output portion 122. The coaxial waveguide 128 includes an inner conductor connected to the center of the antenna 121 and an outer conductor disposed on an outer side of the inner conductor. The mode conversion mechanism is provided between the waveguide 127 and the coaxial waveguide 128. The microwaves output from the microwave output portion 122 propagate within the waveguide 127 in a TE (Transverse Electric) mode and are converted from the TE mode to a TEM (Transverse Electromagnetic) mode by the mode conversion mechanism. The microwaves converted into the TEM mode propagate to the wave retardation plate 126 via the coaxial waveguide 128 and are radiated from the wave retardation plate 126 into the chamber 101 via the slots 121*a* of the antenna 121 and the dielectric window 124. In addition, a tuner (not shown) is provided in the middle of the waveguide 127 to match the impedance of a load (plasma) in the chamber 101 with the output impedance of the microwave output portion 122.

The gas supply mechanism 104 includes a shower ring 142 provided in a ring shape along an inner wall of the chamber 101. The shower ring 142 has a ring-shaped flow path 166 provided therein and a plurality of discharge ports 167 connected to the flow path 166 and opened to an inner side of the shower ring 142. A gas supplier 163 is connected to the flow path 166 via a pipe 161. The gas supplier 163 is provided with a plurality of gas sources and a plurality of flow rate controllers. In one embodiment, the gas supplier 163 is configured to supply at least one process gas from a corresponding gas source to the shower ring 142 via a corresponding flow rate controller. The gas supplied to the shower ring 142 is supplied into the chamber 101 from the plurality of discharge ports 167.

Further, when a graphene film is formed on the substrate W, the gas supplier 163 supplies a carbon-containing gas, a hydrogen-containing gas, and a rare gas (noble gas), which are controlled to a predetermined flow rate, into the chamber 101 via the shower ring 142. In the present embodiment, the carbon-containing gas is, for example, $C_2H_2$ gas. In addition to acetylene ($C_2H_2$) gas, ethylene ($C_2H_4$) gas, methane ($CH_4$) gas, ethane ($C_2H_6$) gas, propane ($C_3H_8$) gas, propylene ($C_3H_6$) gas, methanol ($CH_3OH$) gas, ethanol ($C_2H_5OH$) gas or the like may be used. In the present embodiment, the hydrogen-containing gas is, for example, a hydrogen gas. Instead of or in addition to the hydrogen gas, a halogen-based gas such as fluorine ($F_2$) gas, chlorine ($Cl_2$) gas, or a bromine ($Br_2$) gas may be used. In the present embodiment, the noble gas is, for example, Ar gas. Instead of Ar gas, other noble gases such as He gas may be used.

The exhaust mechanism 105 includes the exhaust chamber 111, an exhaust pipe 181 installed on a sidewall of the exhaust chamber 111, and an exhaust device 182 connected to the exhaust pipe 181. The exhaust device 182 includes a vacuum pump and a pressure control valve.

The controller 11 includes a memory, a processor, and an input/output interface. The memory stores programs executed by the processor and recipes including, e.g., conditions for each process. The processor executes the programs read from the memory and controls each part of the apparatus main body 10 via the input/output interface based on the recipes stored in the memory.

For example, the controller 11 controls each part of the film forming apparatus 1 to perform a film forming method to be described later. In a detailed example, the controller 11 executes a preparing process of loading the substrate W having a metal film into the chamber 101. The controller 11 executes a first process of setting the substrate W to a first temperature, generating plasma by supplying a carbon-containing gas into the chamber 101, and forming a graphene film having a first film thickness on the metal film using the generated plasma. Here, as the carbon-containing gas, acetylene ($C_2H_2$) gas supplied from the gas supplier 163 may be used. Further, the carbon-containing gas is not limited to acetylene. For example, the carbon-containing gas may be any one of ethylene ($C_2H_4$) gas, methane ($CH_4$) gas, ethane ($C_2H_6$) gas, propane ($C_3H_8$) gas, propylene ($C_3H_6$) gas, methanol ($CH_3OH$) gas, and ethanol ($C_2H_5OH$) gas.

[Configuration of Annealing Apparatus 2]

Figure 2:
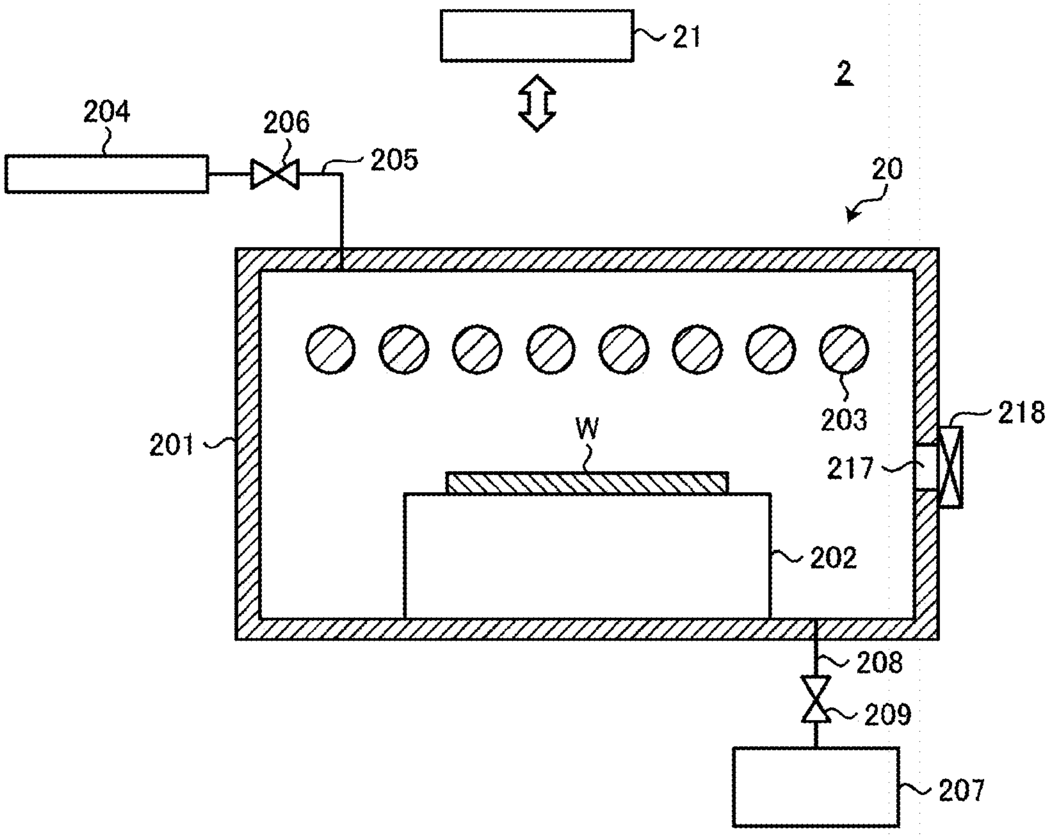
FIG. 2 is a schematic cross-sectional view showing an example of an annealing apparatus according to an embodiment of the present disclosure.

FIG. 2 is a schematic cross-sectional view showing an example of an annealing apparatus according to an embodiment of the present disclosure. An annealing apparatus 2 shown in FIG. 2 is configured as, for example, a lamp heater type annealing apparatus.

The annealing apparatus 2 includes an apparatus main body 20 and a controller 21 that controls the apparatus main body 20. The apparatus main body 20 includes a chamber 201, a stage 202, a lamp heater 203, a gas supply mechanism 204, and an exhaust mechanism 207.

The chamber 201 is formed in an approximately cylindrical shape, and the stage 202 is arranged in an approximately central portion of the bottom of the chamber 201. An opening 217 through which the substrate W passes is formed in a sidewall of the chamber 201, and the opening 217 is opened and closed by a gate valve 218. The chamber 201 is an example of a processing container.

The substrate W as a processing target is placed on the stage 202. The stage 202 has an approximately disc shape and is made of ceramics such as AlN. A lifting pin (not shown) for raising and lowering the substrate W is installed inside the stage 202 so as to protrude and retract relative to an upper surface of the stage 202.

The lamp heater 203 is installed at an upper portion of the chamber 201. The lamp heater 203 heats the substrate W with electromagnetic waves in an infrared band emitted from, for example, a halogen lamp. The lamp heater 203 may control the temperature of the substrate W to, for example, room temperature (RT) to 1100 degrees C. through control of a voltage.

The gas supply mechanism 204 is connected to, for example, the upper portion of the chamber 201 via a pipe 205. A control valve 206 is installed in the pipe 205. The gas supply mechanism 204 includes a plurality of gas sources and a plurality of flow rate controllers. In one embodiment, the gas supply mechanism 204 is configured to supply at least one process gas from a corresponding gas source into the chamber 201 via a corresponding flow rate controller. The process gas may be, for example, a hydrogen-containing gas. The control valve 206 controls the supply of the processing gas to the chamber 201.

The exhaust mechanism 207 is connected to, for example, the bottom of the chamber 201 via a pipe 208. A pressure control valve 209 is installed in the pipe 208. The exhaust mechanism 207 includes a vacuum pump. In one embodiment, the exhaust mechanism 207 is configured to adjust pressure inside the chamber 201 by controlling the vacuum pump and the pressure control valve 209.

The controller 21 includes a memory, a processor, and an input/output interface. The memory stores programs executed by the processor and recipes including conditions for each process. The processor executes the programs read from the memory and controls each part of the apparatus main body 20 via the input/output interface based on the recipes stored in the memory.

For example, the controller 21 controls each part of the annealing apparatus 2 so as to perform a film forming method described later. In a detailed example, the controller 21 executes a process of loading the substrate W on which the first process has been performed in the film forming apparatus 1 into the chamber 201. The controller 21 executes a second process of setting the substrate W to a second temperature higher than the first temperature, reducing a thickness of the graphene film to be less than the first film thickness while maintaining a continuity of the graphene film, and dissolving carbon atoms in solid solution in the metal film. The controller 21 executes a third process of setting the substrate to a third temperature lower than the second temperature, increasing the thickness of the graphene film (i.e., thickening the film) by precipitating the carbon atoms in the metal film at an interface between the metal film and the graphene film, and forming a modified graphene film.

[Thickening of Graphene Film]

Figure 3:
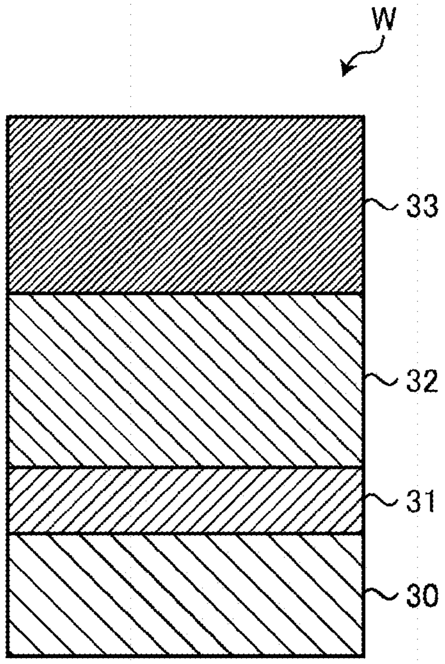
FIG. 3 is a diagram showing an example of the state of a substrate after a graphene film is formed according to the present embodiment.

Next, the thickening of the graphene film will be described with reference to FIGS. 3 to 6. FIG. 3 is a diagram showing an example of the state of a substrate after the graphene film is formed according to the present embodiment. As shown in FIG. 3, the substrate W has a barrier film 31 formed on a silicon substrate 30. The silicon substrate 30 may be made of, for example, silicon or silicon oxide. The barrier film 31 may be, for example, a nitride film including titanium nitride (TiN), tantalum nitride (TaN), or the like. The barrier film 31 has a thickness of, for example, about several nm. A metal film 32 is formed on the barrier film 31. The metal film 32 may be, for example, a metal film made of copper (Cu), tungsten (W), ruthenium (Ru), nickel (Ni), cobalt (Co), or molybdenum (Mo) used for metal fine wiring, or a metal-containing film containing these metals. The metal film 32 has a thickness of, for example, 50 nm or less. A graphene film 33 is formed on the metal film 32. The graphene film 33 has a thickness of 3 nm or more, for example, about 5 nm. The barrier film 31 may be omitted if adhesion between the silicon substrate 30 and the metal film 32 is good.

By performing an annealing process on the metal film 32, a solid solution and a precipitation reaction occur due to carbon in the graphene film 33. For example, when an annealing temperature is set to 1000 degrees C. and the metal film 32 is made of ruthenium, about 0.3% of carbon is dissolved in solid solution in the metal film 32. On the other hand, when the annealing temperature is set to 400 degrees C. and the metal film 32 is made of ruthenium, carbon is not dissolved in solid solution in the metal film 32. When the annealing temperature is set to 1000 degrees C. and the metal film 32 is made of copper, then, for example, about 0.05% of carbon is dissolved in solid solution in the metal film 32. Similarly, when the metal film 32 is made of nickel, about 1.3% of carbon is dissolved in solid solution in the metal film 32. That is, in the annealing process, the annealing temperature is desirably set to about 1000 degrees C.

Figure 4:
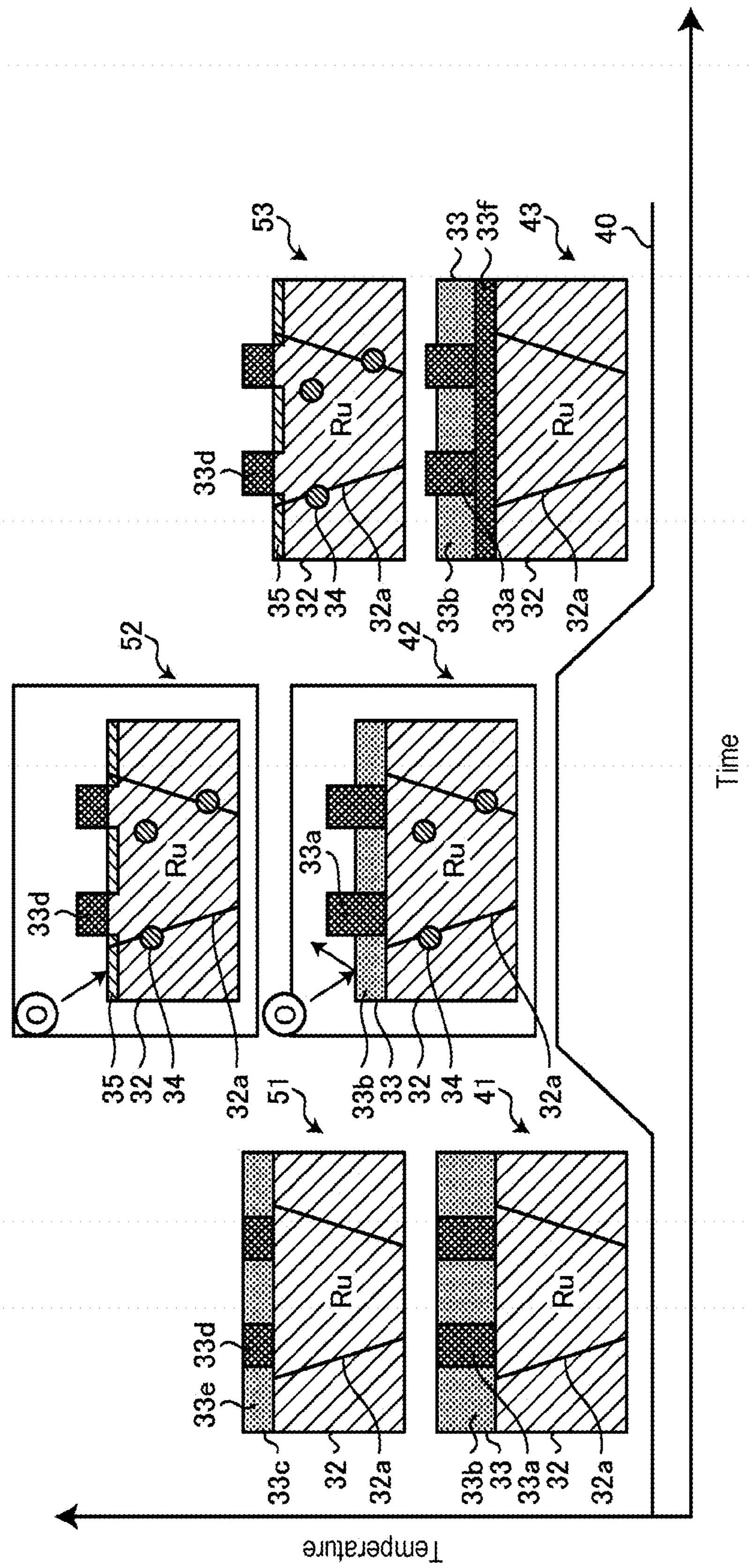
FIG. 4 is a diagram showing an example of an effect of thickening a graphene film.
Figure 5:
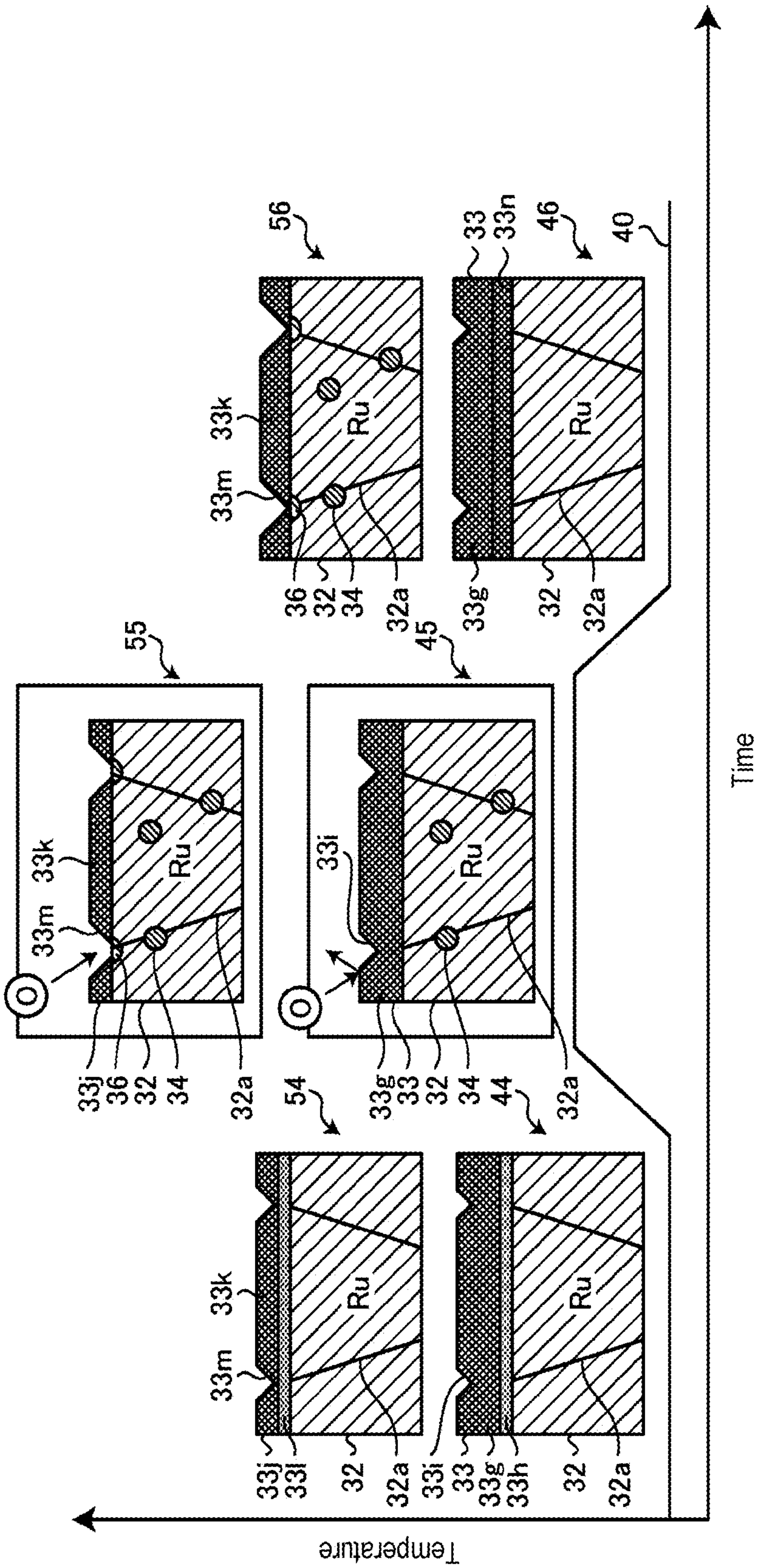
FIG. 5 is a diagram showing an example of an effect of thickening a graphene film.

FIGS. 4 and 5 are diagrams showing an example of an effect of thickening the graphene film. In the thick graphene film 33 and thin graphene films 33*c* and 33*j*, a behavior at interfaces between the metal film 32 and the graphene films 33, 33*c*, and 33*j* when annealing is performed is described with reference to FIGS. 4 and 5. In FIGS. 4 and 5, for comparison, the thin graphene films 33*c* and 33*j* are arranged on an upper stage, and the thick graphene film 33 is arranged on a lower stage. In FIGS. 4 and 5, ruthenium is used as the metal film 32.

First, the case in which amorphous components are mixed in the graphene film in a horizontal direction is described with reference to FIG. 4. In FIG. 4, the substrate W is heated from room temperature to an annealing processing temperature (e.g., 1000 degrees C.) according to a temperature profile 40 and then cooled to room temperature after an annealing process. Here, states 41 and 51 indicate states before the annealing process, states 42 and 52 indicate states during the annealing process, and states 43 and 53 indicate states after the annealing process.

In the state 41, the graphene film 33 formed on the metal film 32 has a crystallized portion 33*a* and an amorphous portion 33*b* arranged in a horizontal direction. Similarly, in the state 51, the graphene film 33*c* formed on the metal film 32 has a crystallized portion 33*d* and an amorphous portion 33*e* arranged in the horizontal direction. In addition, inside the metal film 32, a grain boundary 32*a* is shown as an image of a grain boundary of crystal grains. Here, the graphene film 33*c* is thinner than the graphene film 33.

The states 42 and 52 are states in which the annealing process is started and show heated states from the states 41 and 51. In the states 42 and 52, carbon 34 is dissolved in solid solution in the metal film 32 from the amorphous portions 33*b* and 33*e*. The carbon 34 is dissolved in solid solution mainly along the grain boundary 32*a* of the metal film 32. It is assumed that the carbon 34 is not dissolved in solid solution from the crystallized portions 33*a* and 33*d*. In this case, in the graphene film 33 in the state 42, since the amorphous portion 33*b* is thick, the entire layer of the graphene film 33 is not dissolved in solid solution, and the surface of the metal film 32 is not exposed. Therefore, the surface of the metal film 32 is not oxidized. In contrast, in the state 52, the amorphous portion 33*e* of the graphene film 33*c* disappears, and the surface of the metal film 32 is exposed. The exposed surface of the metal film 32 is oxidized by residual oxygen in the chamber 201, and an oxide film 35 is formed. Since the exposed surface of the metal film 32 more easily reacts than the crystallized portion 33*d*, the residual oxygen reacts with the metal film 32.

The states 43 and 53 are states in which the annealing process is completed and then cooling is performed from the states 42 and 52. In the state 43, the carbon 34 dissolved in solid solution in the metal film 32 is precipitated as a high-crystalline graphene film 33*f*, thereby forming an interface between the high-quality graphene film 33*f* and the metal layer 32. The carbon 34 is precipitated mainly from an upper portion of the grain boundary 32*a*, and the graphene film 33*f* is formed on lower surfaces of the crystallized portion 33*a* and the amorphous portion 33*b*. In this case, the carbon 34 is not precipitated in the direction of the barrier film 31 (not shown) located below the metal film 32. In the states 42 and 43, the movement of metal atoms is suppressed on the surface of the metal film 32 by the crystallized portion 33*a*, the amorphous portion 33*b*, and the graphene film 33*f*. In contrast, in the state 53, the carbon 34 dissolved in solid solution in the metal film 32 cannot be precipitated and remain in the metal film 32 because an upper portion of the grain boundary 32*a* is covered by the oxide film 35. In other words, the surface of the substrate W is in a state in which the crystallized portion 33*d* and the oxide film 35 are mixed, and a high-quality graphene film is not formed.

Next, FIG. 5 illustrates the case in which amorphous components are mixed in the graphene film in a vertical direction. In FIG. 5, the substrate W is heated from room temperature to an annealing temperature (e.g., 1000 degrees C.) according to the temperature profile 40 and cooled to room temperature after the annealing process. Here, states 44 and 54 indicate states before the annealing process, states 45 and 55 indicate states during the annealing process, and states 46 and 56 indicate states after the annealing process.

In the state 44, the graphene film 33 formed on the metal film 32 has a crystallized portion 33*g* and an amorphous portion 33*h* arranged in a vertical direction. The amorphous portion 33*h* is in contact with the metal film 32. The crystallized portion 33*g* has, on the surface of the crystallized portion 33*g*, a thin film portion 33*i*, which is a grain boundary or a defect portion formed when the graphene film grows. Similarly, in the state 54, the graphene film 33*j* formed on the metal film 32 has a crystallized portion 33*k* and an amorphous portion 33*l* arranged in the vertical direction. The amorphous portion 33*l* is in contact with the metal film 32. The crystallized portion 33*k* has, on the surface of crystallized portion 33*k*, a thin film portion 33*m*, which is a grain boundary or a defect portion formed when the graphene film grows. In addition, inside the metal film 32, the grain boundary 32*a* is shown as an image of a grain boundary of crystal grains. Here, the graphene film 33*j* is thinner than the graphene film 33.

The states 45 and 55 are states in which the annealing process is started and show heated states from the states 44 and 54. In the states 45 and 55, the carbon 34 is dissolved in solid solution in the metal film 32 from the amorphous portions 33*h* and 33*l*. The carbon 34 is dissolved in solid solution mainly along the grain boundary 32*a* of the metal film 32. In this case, since the crystallized portion 33*g* in the graphene film 33 is thick in the state 45, a bottom of the thin film portion 33*i* does not reach the metal film 32, and thus the surface of the metal film 32 is not exposed. Therefore, the surface of the metal film 32 is not oxidized. In contrast, in the state 55, since the crystallized portion 33*k* is thin, a bottom of the thin film portion 33*m* reaches the metal film 32, and thus the surface of the metal film 32 is exposed. The exposed surface of the metal film 32 is oxidized by residual oxygen in the chamber 201, and an oxide film 36 is formed. Since the exposed surface of the metal film 32 more easily reacts than the crystallized portion 33*k*, the residual oxygen reacts with the metal film 32.

The states 46 and 56 are states in which the annealing process is completed and cooling is performed from the states 45 and 55. In the state 46, the carbon 34 dissolved in solid solution in the metal film 32 is precipitated as a high-crystalline graphene film 33*n*, thereby forming an interface between the high-quality graphene film 33*n* and the metal film 32. The carbon 34 is precipitated mainly from the upper portion of the grain boundary 32*a*, and the graphene film 33*n* is formed on a lower surface of the crystallized portion 33*g*. In this case, the carbon 34 is not precipitated in the direction of the barrier film 31 (not shown) located below the metal film 32. In the states 45 and 46, the movement of metal atoms is suppressed on the surface of the metal film 32 by the crystallized portion 33*g* and the graphene film 33*n*. In contrast, in the state 56, the carbon 34 dissolved in the solid solution in the metal film 32 cannot be precipitated and remain in the metal film 32 because the upper portion of the grain boundary 32*a* is covered by the oxide film 36. That is, the surface of the substrate W is in a state in which the crystallized portion 33*k* and the oxide film 36 of the bottom of the thin film portion 33*m* are mixed, and a high-quality graphene film is not formed.

In addition, the graphene film may suppress the movement of atoms due to self-diffusion of the atoms in the metal film 32 when annealing is performed by thickening the graphene film like the graphene film 33 in FIGS. 4 and 5. For example, if annealing is performed in a state in which the metal film 32 is exposed without forming the graphene film, the atoms move to generate holes due to self-diffusion on the surface of the metal film 32. Next, when annealing is performed by forming the graphene film on the metal film 32, for example, when the thickness of the graphene film is set to be less than 2 nm, minute holes called black dots are generated in the graphene film due to self-diffusion of atoms (e.g., ruthenium atoms) of the metal film 32. In contrast, for example, when the thickness of the formed graphene film is set to 3 nm or more, for example, about 5 nm, it is considered that black dots are hardly generated and the movement of metal atoms (transport of metal atoms) on the surface of the metal film 32 may be suppressed. That is, the movement of metal atoms may be suppressed by thickening the graphene film as in the graphene film 33 according to the present embodiment, thereby improving the film quality of the metal film 32.

Figure 6:
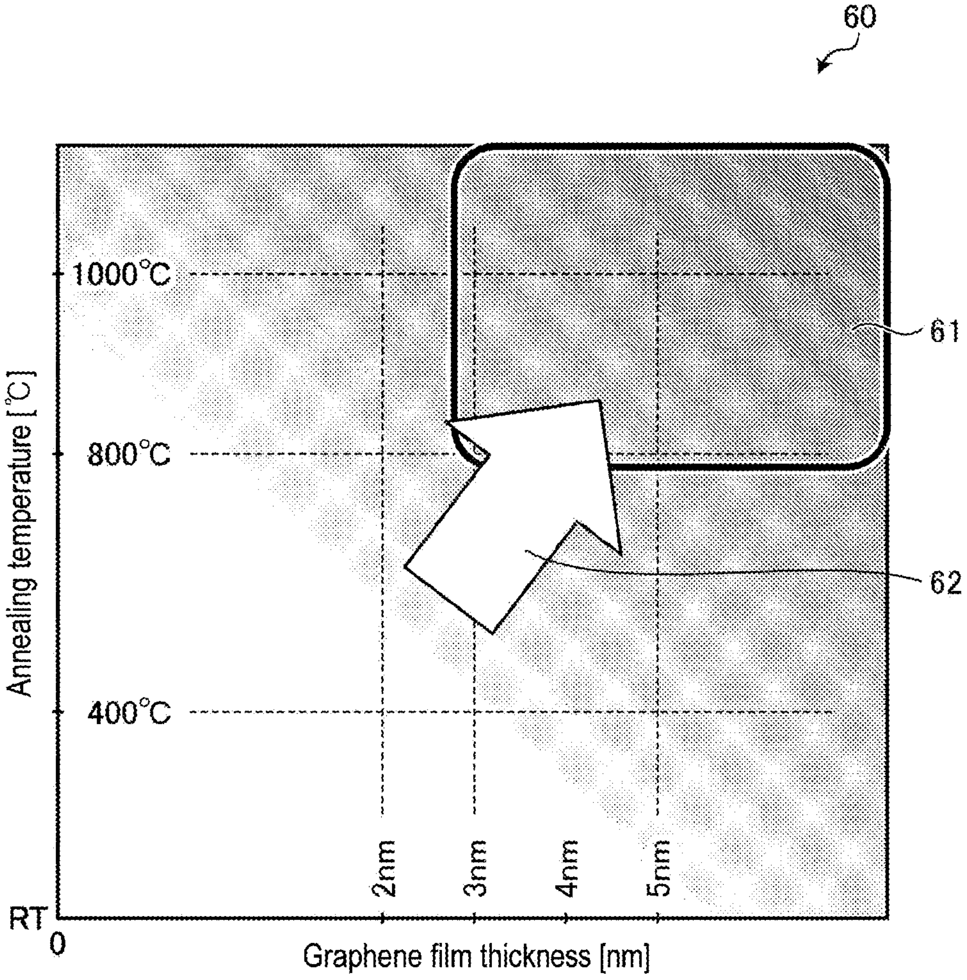
FIG. 6 is a diagram showing an example of the relationship between the thickness of a graphene film and an annealing temperature.

Next, the relationship between the thickness of the graphene film and the annealing temperature will be described with reference to FIG. 6. FIG. 6 is a diagram showing an example of the relationship between the thickness of the graphene film and the annealing temperature. In a graph 60 shown in FIG. 6, regions are divided based on film thickness and temperature with a change in characteristics when a horizontal axis represents the thickness of the graphene film and a vertical axis represents the annealing temperature. The graph 60 is an example when ruthenium is used as the metal film 32.

In the graph 60, when the thickness of the graphene film is in a range of 0 nm to less than 2 nm, the graphene film is discontinuous. When thickness of the graphene film is in a range of 2 nm to less than 3 nm, the graphene film maintains a continuity thereof, but interfacial characteristics are dominant. The continuity of the graphene film refers to a state in which ruthenium is not exposed. When the thickness of the graphene film is in a range of 3 nm or more, the graphene film exhibits bulk characteristics in addition to the interfacial characteristics. In this range of film thickness, the interfacial characteristics and bulk characteristics of the graphene film contribute to crystal growth of ruthenium. In other words, the movement of ruthenium atoms is suppressed. In addition, when the annealing temperature is in a range of room temperature (RT) to 400 degrees C., there is no reaction in terms of crystal growth of ruthenium. When the annealing temperature is in a range of 400 degrees C. to 800 degrees C., crystal grains of ruthenium grow, thereby causing aggregation or surface roughness. When the annealing temperature is in a range of 800 degrees C. to 1000 degrees C., the catalytic action of ruthenium promotes the desorption or dissolution in solid solution of the graphene. When the annealing temperature is in a range of 1000 degrees C. or higher, the quality of the graphene film is improved by a solid solution and a precipitation reaction.

In this regard, it may be appreciated that the film quality of the graphene film and the underlying metal film may be improved by performing film formation in a range of graphene film thickness of 3 nm or more and performing annealing in a range of annealing temperature of 800 degrees C. or higher, as indicated by a region 61. In other words, in the relationship between the thickness of the graphene film and the annealing temperature, high quality may be achieved and surface roughness of the metal film 32 may be suppressed in a direction shown by an arrow 62 (a direction in which gradation becomes darker) in the graph 60. In addition, if the thickness of the graphene film 33 on the substrate W after annealing processing is required to be thinner than 3 nm, the surface of the graphene film 33 may be shaved to obtain a desired thickness.

[Film Forming Method]

Figure 7:
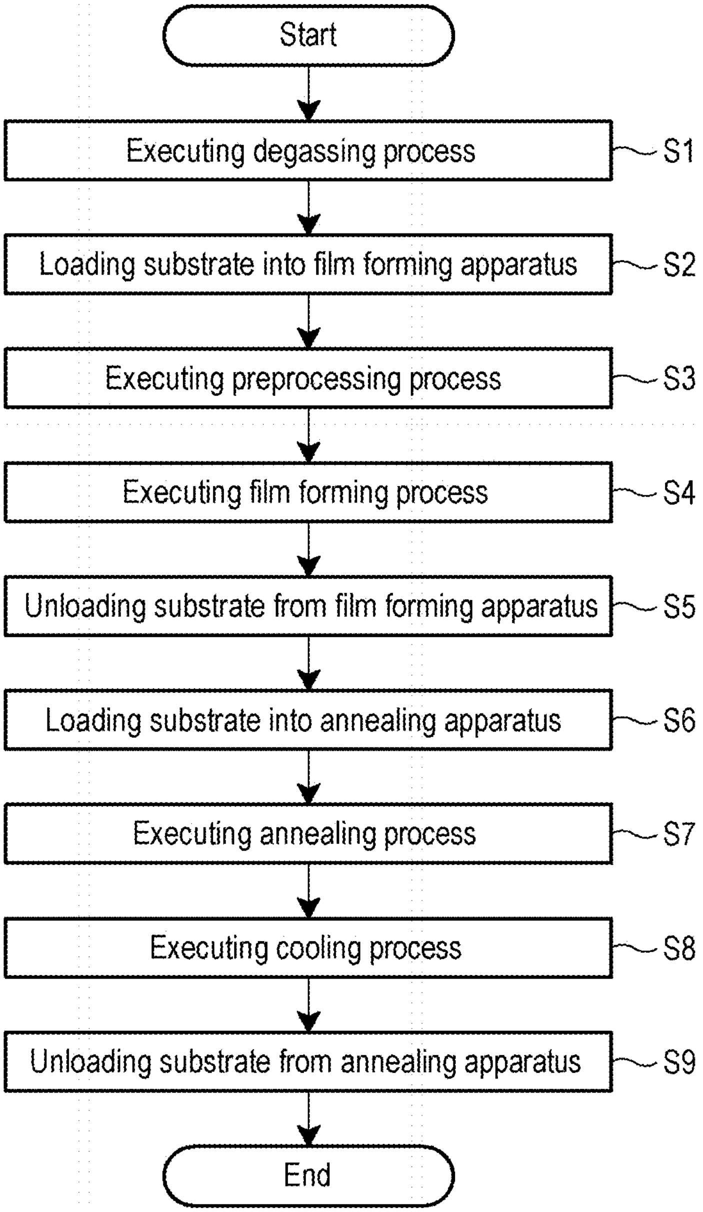
FIG. 7 is a flowchart showing an example of a film forming method according to the present embodiment.

Next, the film forming method according to the present embodiment will be described. FIG. 7 is a flow chart showing an example of the film forming method according to the present embodiment.

In the film forming method according to the present embodiment, first, a film forming process is performed in the film forming apparatus 1. The controller 11 of the film forming apparatus 1 executes a degassing process of removing residual oxygen in a state in which the inside of the chamber 101 is cleaned (step S1). The controller 11 controls the gate valve 118 to open the opening 117. When the opening 117 is open, a dummy wafer is loaded into a processing space of the chamber 101 through the opening 117 and placed on the stage 102. The controller 11 controls the gate valve 118 to close the opening 117.

The controller 11 controls the gas supplier 163 to supply a hydrogen-containing gas from the plurality of discharge ports 167 to the chamber 101. The controller 11 controls the exhaust mechanism 105 to control pressure inside the chamber 101 to a predetermined pressure (e.g., 50 mTorr to 1 Torr (6.67 Pa to 133 Pa)). As the hydrogen-containing gas or nitrogen-containing gas in the degassing process, for example, $H_2$ gas, $N_2$ gas, a mixture gas of $H_2$ gas and $N_2$ gas, or a mixture gas of one of aforementioned gases and Ar gas may be used. The controller 11 controls the microwave introduction mechanism 103 to ignite plasma. The controller 11 executes the degassing process using plasma of the hydrogen-containing gas or the nitrogen-containing gas for a predetermined time (e.g., 120 to 600 seconds). In the degassing process, oxidizing components, such as $O_2$ and $H_2O$, remaining in the chamber 101 are discharged as O-containing radicals. The dummy wafer may not be used in the degassing process. The degassing process may be omitted.

When the degassing process is completed, the controller 11 controls the gate valve 118 to open the opening 117. The substrate W having the metal film 32 is loaded into the processing space of the chamber 101 through the opening 117 when the opening 117 is open and is placed on the stage 102. That is, the controller 11 controls the apparatus main body 10 to load the substrate W having the metal film 32 into the chamber 101 (step S2). The controller 11 controls the gate valve 118 to close the opening 117. Step S2 is an example of a process of preparing the substrate W having the metal film 32.

The controller 11 controls the exhaust mechanism 105 to reduce the pressure inside the chamber 101 to a predetermined pressure (e.g., 50 mTorr to 1 Torr). The controller 11 controls the gas supplier 163 to supply the hydrogen-containing gas and the carbon-containing gas, which are plasma generating gases, to the chamber 101 from the discharge port 167. The hydrogen-containing gas is a gas containing hydrogen ($H_2$) gas and an inert gas (Ar gas). The carbon-containing gas is a gas containing a hydrocarbon gas (e.g., $C_2H_2$ gas) represented as $C_xH_y$ (x and y are natural numbers). The controller 11 controls the microwave introduction mechanism 103 to ignite the plasma by microwaves of a predetermined power (e.g., 100 W to 1500 W). The controller 11 executes a preprocessing process for improving various characteristics of the surface of the metal film 32 using the plasma of the hydrogen-containing gas and the carbon-containing gas for a predetermined time (e.g., 5 seconds to 15 minutes) (step S3). For example, in the preprocessing process, the adhesion between the metal film 32 and the graphene film 33 is improved.

The plasma generating gas may be one or more of $H_2$ gas, $C_xH_y$ gas, and Ar gas. In addition, even if the $C_xH_y$ gas is supplied, the graphene film is not formed in the preprocessing process. Furthermore, in addition to plasma processing or instead of plasma processing, annealing processing may be performed in the preprocessing process. When annealing processing is performed, the pressure inside the chamber 101 is reduced to a predetermined pressure (e.g., 50 mTorr to 1 Torr), and, for example, the hydrogen-containing gas is supplied to the chamber 101. The preprocessing process may be omitted.

When the preprocessing process is completed, the controller 11 stops the microwaves to stop the generation of the plasma. The controller 11 controls the exhaust mechanism 105 to reduce the pressure inside the chamber 101 to a predetermined pressure (e.g., 1 mTorr to 1 Torr (0.133 Pa to 133 Pa)). The controller 11 controls the heater power supply 115 to heat the substrate W to a first temperature (e.g., 300 degrees C. to 500 degrees C.). The controller 11 controls the gas supplier 163 to supply the hydrogen-containing gas and the carbon-containing gas, which are plasma generating gases, from the discharge port 167 to the chamber 101. The hydrogen-containing gas is a gas containing hydrogen ($H_2$) gas and an inert gas (Ar gas). In addition, the inert gas may be used as the plasma generating gas instead of the hydrogen-containing gas. The carbon-containing gas is, for example, $C_2H_2$ gas or $C_2H_4$ gas. The controller 11 controls the microwave introduction mechanism 103 to ignite the plasma with a predetermined power (e.g., 300 W to 1500 W). The controller 11 executes a film formation process (first process) of forming the graphene film 33 having a first film thickness (e.g., 3 nm to 10 nm) on the metal film 32 using the plasma of the hydrogen-containing gas and the carbon-containing gas for a predetermined time (e.g., 5 seconds to 15 minutes) (step S4).

When the film formation process is completed, the controller 11 stops the microwaves to stop the generation of plasma. The controller 11 controls the gate valve 118 to open the opening 117. The controller 11 controls the apparatus main body 10 to lift the substrate W by protruding the substrate support pin (not shown) from the upper surface of the stage 102. When the opening 117 is open, the substrate W is loaded into the chamber 101 by an arm of a transfer chamber, which is not shown, through the opening 117. That is, the controller 11 controls the apparatus main body 10 to unload the substrate W from the chamber 101 (step S5). Thereafter, the substrate W is loaded into the annealing apparatus 2 by the arm of the transfer chamber which is not shown.

When the film formation process in the film forming apparatus 1 is completed, an annealing process is executed in the annealing apparatus 2. The controller 21 of the annealing apparatus 2 controls the gate valve 218 to open the opening 217. When the opening 217 is open, the substrate W is loaded into the processing space of the chamber 201 through the opening 217 and placed on the stage 202. That is, the controller 21 controls the apparatus main body 20 to load the substrate W into the chamber 201 (step S6). The controller 21 controls the gate valve 218 to close the opening 217.

The controller 21 controls the exhaust mechanism 207 to reduce pressure inside the chamber 201 to a predetermined pressure (e.g., 50 mTorr to 1 Torr). The controller 21 controls the gas supply mechanism 204 to supply the hydrogen-containing gas to the chamber 201. The controller 21 controls the lamp heater 203 to heat the substrate W to a second temperature (e.g., 800 degrees C. to 1100 degrees C.) higher than the first temperature. The controller 21 executes an annealing process (second process) of heating the substrate W for a predetermined time (e.g., 5 seconds to 10 minutes), reducing the thickness of the graphene film 33 to be less than the first thickness while maintaining a continuity of the graphene film 33, and dissolving carbon atoms in solid solution in the metal film 32 (step S7).

When the annealing process is completed, the controller 21 stops the lamp heater 203. The controller 21 controls the gas supply mechanism 204 and the exhaust mechanism 207 to supply, for example, an inert gas (e.g., $N_2$ gas) to the chamber 201 as a purge gas and exhaust the chamber. In other words, the controller 21 controls the gas supply mechanism 204 and the exhaust mechanism 207 to cool the substrate W to a third temperature (e.g., room temperature) lower than the second temperature. The controller 21 executes a cooling process (third process) of cooling the substrate W to a third temperature, increasing the thickness of the graphene film 33 by precipitating the carbon atoms in the metal film 32 at an interface between the metal film 32 and the graphene film 33, and forming the modified graphene film 33 (step S8).

When the cooling process is completed, the controller 21 stops the supply and exhaust of the inert gas. The controller 21 controls the gate valve 218 to open the opening 217. The controller 21 controls the apparatus main body 20 to lift the substrate W by protruding the substrate support pin, which is not shown, from the upper surface of the stage 202. When the opening 217 is open, the substrate W is unloaded from the chamber 201 by an arm of a transfer chamber which is not shown through the opening 217. That is, the controller 21 controls the apparatus main body 20 to unload the substrate W from the chamber 201 (step S9). In this way, the film quality of the graphene film 33 and the underlying metal film 32 may be improved by performing the annealing process of heating the substrate to the second temperature after the film formation process. In addition, since the adhesion between the graphene film 33 and the metal film 32 is improved, peeling of the graphene film 33 may also be suppressed.

[Experimental Results]

Figure 8:
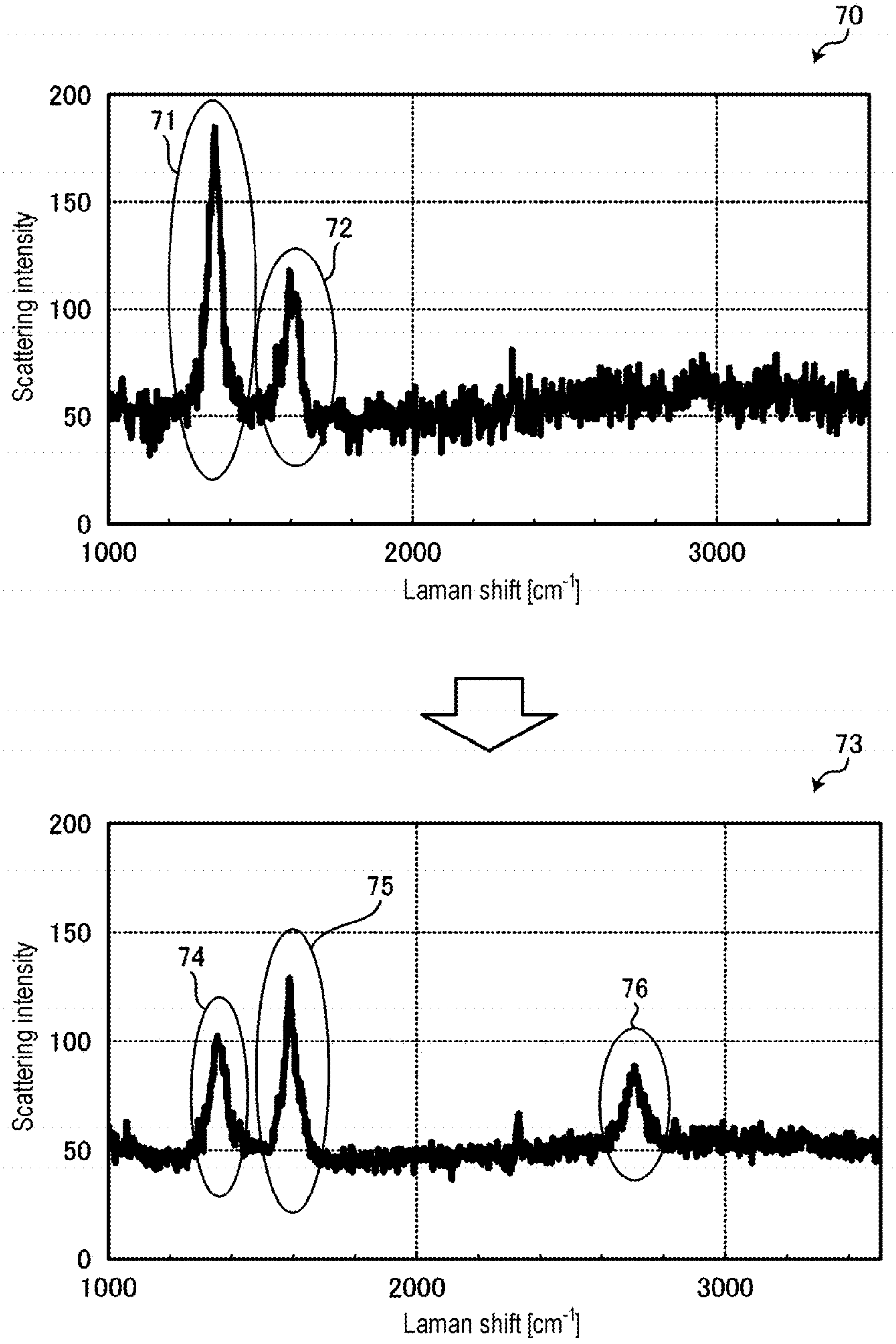
FIG. 8 is a diagram showing an example of experimental results according to the present embodiment.
Figure 9:
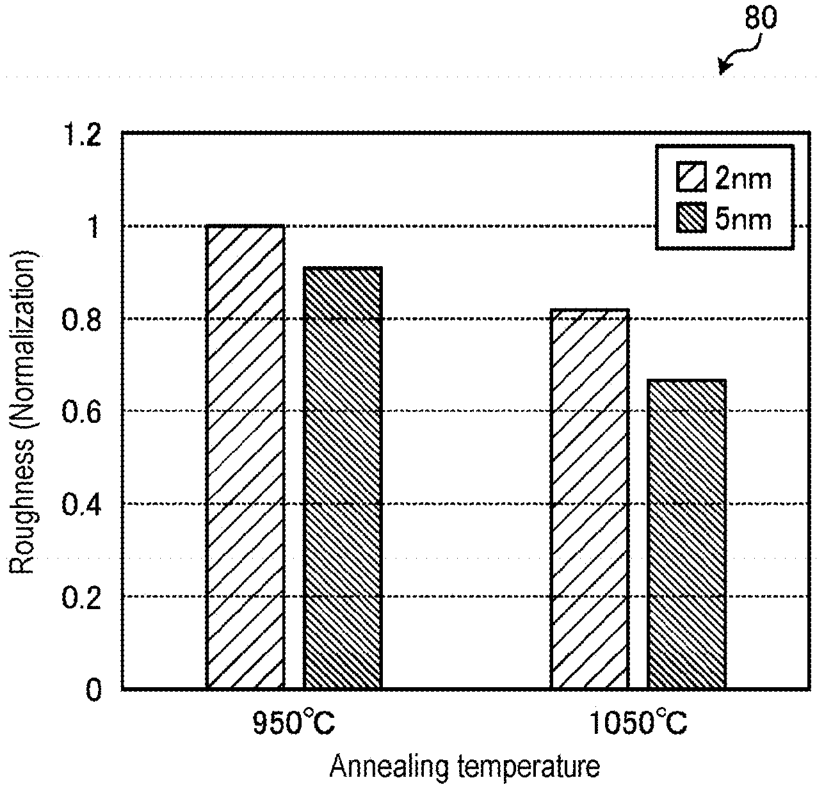
FIG. 9 is a diagram showing an example of experimental results according to the present embodiment.

Next, the experimental results of the present embodiment will be described with reference to FIGS. 8 and 9. FIGS. 8 and 9 are diagrams showing examples of experimental results according to the present embodiment. A graph 70 in FIG. 8 shows a Raman spectrum obtained by forming the graphene film 33 on the substrate W to a thickness of 2 nm before the annealing process is performed. In the graph 70, a scattering intensity of a D band which indicates a defect of a peak 71 is high. Further, a scattering intensity of a G band which indicates good film quality of a peak 72 is lower than the scattering intensity of the peak 71. A peak of a G' band does not appear in the graph 70.

A graph 73 is a Raman spectrum after annealing is performed at a temperature of 1050 degrees C. for 1 minute on the substrate W on which the graphene film 33 has been formed to a thickness of 2 nm. In a graph 73, a scattering intensity of a D band of a peak 74 is significantly reduced, and a scattering intensity of a G band of a peak 75 and a scattering intensity of a G' band of a peak 76 are significantly increased, compared to the graph 70. That is, since values of G/D and G'/D, which are indicators of the film quality of the graphene film 33, also increase from the state of the graph 70, it may be appreciated that the film quality of the graphene film 33 is significantly improved by the annealing process. That is, it may be appreciated that the high quality of the graphene film 33 is obtained by the annealing process. In addition, surface roughness (root mean square (RMS) roughness in nanometers (nm)) is 0.34 before the annealing process in the graph 70 and 0.35 after the annealing process in the graph 73. Namely, the surface is not roughened even after the annealing process is performed, and the state after the formation of the graphene film 33 is maintained.

A graph 80 in FIG. 9 shows a comparison of the surface roughness of the metal film 32 when a graphene film is thickened by normalizing, to “1”, the surface roughness in the case in which the film thickness of the graphene film is 2 nm and an annealing temperature is 950 degrees C. Ruthenium is used as the metal film 32. As shown in the graph 80, when the annealing temperature is 950 degrees C., since the surface roughness of the metal film 32 is about 0.9 with respect to a film thickness of 5 nm, compared to the value of “1” with respect to a film thickness of 2 nm, it may be appreciated that the surface roughness of the metal film 32 is improved by thickening the graphene film. When the annealing temperature is 1050 degrees C., the surface roughness of the metal film 32 is about 0.81 with respect to the film thickness of the graphene film of 2 nm, and it may be appreciated that the surface roughness of the metal film 32 is improved compared to the case in which the annealing temperature is 950 degrees C. Furthermore, when the annealing temperature is 1050 degrees C., the surface roughness of the metal film 32 is about 0.65 with respect to the film thickness of the graphene film of 5 nm, and it may be appreciated that the surface roughness of the metal film 32 is improved compared to the case in which the annealing temperature is 950 degrees C. and the film thickness is 5 nm and the case in which the annealing temperature is 1050 degrees C. and the film thickness is 2 nm. That is, it may be appreciated from the experimental results of the graph 80 that the surface roughness of the metal film 32 may be most improved when the annealing processing is performed at a temperature of 1050 degrees C. with respect to the graphene film having a film thickness of 5 nm.

As described above, according to the present embodiment, the film forming system includes the film forming apparatus 1 and the annealing apparatus 2. The film forming apparatus 1 and the annealing apparatus 2 include processing containers (chambers 101 and 201) capable of accommodating the substrate W having the metal film 32, and the controllers 11 and 21, respectively. The controller 11 of the film forming apparatus 1 executes a process of loading the substrate W into the processing container of the film forming apparatus 1, and a first process of setting the substrate W to a first temperature, generating plasma by supplying a carbon-containing gas, and forming the graphene film 33 having a first film thickness on the metal film 32 using the generated plasma. Moreover, the controller 21 of the annealing apparatus 2 executes a process of loading the substrate W into the processing container of the annealing apparatus 2, a second process of setting the substrate W to a second temperature higher than the first temperature, reducing the thickness of the graphene film to be less than the first film thickness while maintaining a continuity of the graphene film 33, and dissolving carbon atoms in solid solution in the metal film 32, and a third process of setting the substrate to a third temperature lower than the second temperature, increasing the thickness of the graphene film 33 by precipitating the carbon atoms in the metal film 32 at an interface between the metal film 32 and the graphene film 33, and forming the modified graphene film 33. As a result, it is possible to improve the film quality of the graphene film 33 and the underlying metal film 32.

According to the present embodiment, the carbon-containing gas includes a plasma excitation gas, and the first process includes generating the plasma by microwaves. As a result, it is possible to form the graphene film 33 on the metal film 32.

According to the present embodiment, the plasma excitation gas includes at least one of Ar gas or $H_2$ gas. As a result, it is possible to generate plasma suitable for graphene film formation.

According to the present embodiment, the carbon-containing gas includes at least one of $C_2H_2$ gas, $C_2H_4$ gas, $CH_4$ gas, $C_2H_6$ gas, $C_3H_8$ gas, $C_3H_6$ gas, $CH_3OH$ gas, or $C_2H_5OH$ gas. As a result, it is possible to form the graphene film on the substrate W.

According to the present embodiment, the second process is processed in an atmosphere of an inert gas. As a result, it is possible to improve the film quality of the graphene film 33 and the underlying metal film 32.

According to the present embodiment, the inert gas includes at least one of $N_2$ gas or Ar gas. As a result, it is possible to improve the film quality of the graphene film 33 and the underlying metal film 32.

According to the present embodiment, the metal film 32 includes at least one of Ru, Ni, Co, or Cu. As a result, it is possible to form a high-quality graphene film at an interface between the graphene film 33 and the metal film 32.

According to the present embodiment, the substrate W has an underlying film (the barrier film 31) below the metal film 32, and the underlying film includes any one of TiN and TaN. As a result, it is possible to suppress the carbon atoms dissolved in solid solution in the metal film 32 from being precipitated on the silicon substrate 30 side.

According to the present embodiment, the first temperature is in a range of 300 degrees C. to 500 degrees C. As a result, it is possible to form the graphene film 33 on the metal film 32.

According to the present embodiment, the second temperature is in a range of 800 degrees C. to 1100 degrees C. As a result, it is possible to dissolve the carbon atoms in solid solution in the metal film 32 from the graphene film 33.

According to the present embodiment, the third temperature is in a range of 0 degrees C. to 400 degrees C. As a result, it is possible to precipitate the carbon atoms in the graphene film 33 from the metal film 32.

Furthermore, according to the present embodiment, the first film thickness is in a range of 3 nm to 10 nm. As a result, even if an annealing process is performed, the metal film 32 is not exposed, and the movement of metal atoms at an interface of the metal film 32 may be suppressed. In other words, it is possible to prevent the surface oxidation of the metal film 32 while improving the film quality of the metal film 32.

It should be noted that the embodiments disclosed herein are exemplary in all aspects and are not restrictive. The above-described embodiments may be omitted, replaced, or modified in various forms without departing from the scope and spirit of the appended claims.

In the above embodiments, while the lamp heater 203 has been used as a heat source of the annealing apparatus 2, the disclosed technology is not limited thereto. For example, the heat source of the annealing apparatus 2 may be various heat sources such as a laser and a stage heater.

In the above embodiments, while the annealing process has been performed on a single wafer, the disclosed technology is not limited thereto. For example, the annealing process may be performed in a batch process on a plurality of substrates W after the film formation process is completed.

In the above embodiments, while the film forming apparatus 1 has been described as an example that performs etching or film formation on the substrate W using microwave plasma as a plasma source, the disclosed technology is not limited thereto. As long as an apparatus performs processing on the substrate W using plasma, the plasma source is not limited to microwave plasma, and any plasma source, such as capacitively coupled plasma, inductively coupled plasma, magnetron plasma, etc., may be used.

The present disclosure may take the following configurations.

(1) A film forming method of forming a graphene film, including:

a process of preparing a substrate including a metal film;

a first process of setting the substrate to a first temperature, generating plasma by supplying a carbon-containing gas, and forming the graphene film having a first film thickness on the metal film using the generated plasma;

a second process of setting the substrate to a second temperature higher than the first temperature, reducing a thickness of the graphene film to be less than the first film thickness while maintaining a continuity of the graphene film, and dissolving carbon atoms in solid solution in the metal film; and a third process of setting the substrate to a third temperature lower than the second temperature, increasing the thickness of the graphene film by precipitating the carbon atoms in the metal film at an interface between the metal film and the graphene film, and forming a modified graphene film.

(2) The film forming method set forth in (1), wherein the carbon-containing gas includes a plasma excitation gas, and the first process includes generating the plasma by microwaves.

(3) The film forming method set forth in (2), wherein the plasma excitation gas includes at least one of Ar gas or $H_2$ gas.

(4) The film forming method set forth in any one of (1) to (3), wherein the carbon-containing gas includes at least one of $C_2H_2$ gas, $C_2H_4$ gas, $CH_4$ gas, $C_2H_6$ gas, $C_3H_8$ gas, $C_3H_6$ gas, $CH_3OH$ gas, or $C_2H_5OH$ gas.

(5) The film forming method set forth in any one of (1) to (4), wherein the second process is performed in an atmosphere of an inert gas.

(6) The film forming method set forth in (5), wherein the inert gas includes at least one of $N_2$ gas or Ar gas.

(7) The film forming method set forth in any one of (1) to (6), wherein the metal film includes at least one of Ru, Ni, Co, or Cu.

(8) The film forming method set forth in any one of (1) to (7), wherein the substrate includes an underlying film below the metal film, and the underlying film includes any one of TiN and TaN.

(9) The film forming method set forth in any one of (1) to (8), wherein the first temperature is in a range of 300 degrees C. to 500 degrees C.

(10) The film forming method set forth in any one of (1) to (9), wherein the second temperature is in a range of 800 degrees C. to 1100 degrees C.

(11) The film forming method set forth in any one of (1) to (10), wherein the third temperature is in a range of 0 degrees C. to 400 degrees C.

(12) The film forming method set forth in any one of (1) to (11), wherein the first film thickness is in a range of 3 nm to 10 nm.

(13) A film forming system including a film forming apparatus and an annealing apparatus, wherein each of the film forming apparatus and the annealing apparatus includes:

a processing container capable of accommodating a substrate including a metal film; and a controller, wherein the controller of the film forming apparatus is configured to control the film forming apparatus to load the substrate into the processing container of the film forming apparatus, wherein the controller of the film forming apparatus is configured to control the film forming apparatus to set the substrate to a first temperature, generate plasma by supplying a carbon-containing gas, and form a graphene film having a first film thickness on the metal film using the generated plasma, wherein the controller of the annealing apparatus is configured to control the annealing apparatus to load the substrate into the processing container of the annealing apparatus, wherein the controller of the annealing apparatus is configured to control the annealing apparatus to set the substrate to a second temperature higher than the first temperature, reduce a thickness of the graphene film to be less than the first film thickness while maintaining a continuity of the graphene film, and dissolve carbon atoms in solid solution in the metal film, and wherein the controller of the annealing apparatus is configured to control the annealing apparatus to set the substrate to a third temperature lower than the second temperature, increase the thickness of the graphene film by precipitating the carbon atoms in the metal film at an interface between the metal film and the graphene film, and form a modified graphene film.

According to the present disclosure in some embodiments, it is possible to improve the film quality of a graphene film and an underlying metal film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method of forming a graphene film, comprising:

a process of preparing a substrate including a metal film;

a first process of setting the substrate to a first temperature, generating plasma by supplying a carbon-containing gas, and forming the graphene film having a first film thickness on the metal film using the generated plasma;

a second process of setting the substrate to a second temperature higher than the first temperature, reducing a thickness of the graphene film to be less than the first film thickness while maintaining a continuity of the graphene film, and dissolving carbon atoms in a solid solution in the metal film; and a third process of setting the substrate to a third temperature lower than the second temperature, increasing the thickness of the graphene film by precipitating the carbon atoms in the metal film at an interface between the metal film and the graphene film, and forming a modified graphene film, wherein the continuity of the graphene film is a state in which the metal film is not exposed.

2. The film forming method of claim 1, wherein the carbon-containing gas includes a plasma excitation gas, and wherein the first process includes generating the plasma by microwaves.

3. The film forming method of claim 2, wherein the plasma excitation gas includes at least one of Ar gas or $H_2$ gas.

4. The film forming method of claim 1, wherein the carbon-containing gas includes at least one of $C_2H_2$ gas, $C_2H_4$ gas, $CH_4$ gas, $C_2H_6$ gas, $C_3H_8$ gas, $C_3H_6$ gas, $CH_3OH$ gas, or $C_2H_5OH$ gas.

5. The film forming method of claim 1, wherein the second process is performed in an atmosphere of an inert gas.

6. The film forming method of claim 5, wherein the inert gas includes at least one of $N_2$ gas or Ar gas.

7. The film forming method of claim 1, wherein the metal film includes at least one of Ru, Ni, Co, or Cu.

8. The film forming method of claim 1, wherein the substrate includes an underlying film below the metal film, and wherein the underlying film includes any one of TiN and TaN.

9. The film forming method of claim 1, wherein the first temperature is in a range of 300 degrees C. to 500 degrees C.

10. The film forming method of claim 1, wherein the second temperature is in a range of 800 degrees C. to 1100 degrees C.

11. The film forming method of claim 1, wherein the third temperature is in a range of 0 degrees C. to 400 degrees C.

12. The film forming method of claim 1, wherein the first film thickness is in a range of 3 nm to 10 nm.

13. A film forming system including a film forming apparatus and an annealing apparatus, wherein each of the film forming apparatus and the annealing apparatus includes:

a processing container capable of accommodating a substrate including a metal film; and a controller, wherein the controller of the film forming apparatus is configured to control the film forming apparatus to load the substrate into the processing container of the film forming apparatus, wherein the controller of the film forming apparatus is configured to control the film forming apparatus to set the substrate to a first temperature, generate plasma by supplying a carbon-containing gas, and form a graphene film having a first film thickness on the metal film using the generated plasma, wherein the controller of the annealing apparatus is configured to control the annealing apparatus to load the substrate into the processing container of the annealing apparatus, wherein the controller of the annealing apparatus is configured to control the annealing apparatus to set the substrate to a second temperature higher than the first temperature, reduce a thickness of the graphene film to be less than the first film thickness while maintaining a continuity of the graphene film, and dissolve carbon atoms in a solid solution in the metal film, wherein the controller of the annealing apparatus is configured to control the annealing apparatus to set the substrate to a third temperature lower than the second temperature, increase the thickness of the graphene film by precipitating the carbon atoms in the metal film at an interface between the metal film and the graphene film, and form a modified graphene film, and wherein the continuity of the graphene film is a state in which the metal film is not exposed.

* * * * *